United States Patent
Hourani et al.

(10) Patent No.: US 10,269,622 B2
(45) Date of Patent: Apr. 23, 2019

(54) MATERIALS AND DEPOSITION SCHEMES USING PHOTOACTIVE MATERIALS FOR INTERFACE CHEMICAL CONTROL AND PATTERNING OF PREDEFINED STRUCTURES

(71) Applicant: INTEL CORPORATION, Santa Clara, CA (US)

(72) Inventors: Rami Hourani, Portland, OR (US); Michael J. Leeson, Portland, OR (US); Todd R. Younkin, Portland, OR (US); Eungnak Han, Portland, OR (US); Robert L. Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/529,479

(22) PCT Filed: Dec. 24, 2014

(86) PCT No.: PCT/US2014/072387
§ 371 (c)(1),
(2) Date: May 24, 2017

(87) PCT Pub. No.: WO2016/105421
PCT Pub. Date: Jun. 30, 2016

(65) Prior Publication Data
US 2017/0263496 A1    Sep. 14, 2017

(51) Int. Cl.
*H01L 21/768* (2006.01)
*H01L 23/522* (2006.01)
(Continued)

(52) U.S. Cl.
CPC ...... *H01L 21/76816* (2013.01); *G03F 7/0035* (2013.01); *G03F 7/165* (2013.01);
(Continued)

(58) Field of Classification Search
CPC .................................................... H01L 21/768
See application file for complete search history.

(56) References Cited

U.S. PATENT DOCUMENTS 6,423,465 B1    7/2002 Hawker et al.
6,569,760 B1    5/2003 Lin et al.
(Continued)

OTHER PUBLICATIONS

International Searching Authority at the Korean Intellectual Property Office, International Search Report and Written Opinion for International Patent Application No. PCT/US2014/072387, dated Aug. 31, 2015, 9 pages.
(Continued)

*Primary Examiner* — Marvin Payen
(74) *Attorney, Agent, or Firm* — Schwabe, Williamson & Wyatt, P.C.

(57) ABSTRACT

Embodiments of the invention include microelectronic devices and methods of forming such devices. In an embodiment, a microelectronic device, includes one or more pre-patterned features formed into a interconnect layer, with a conformal barrier layer formed over the first wall, and the second wall of one or more of the pre-patterned features. A photoresist layer may formed over the barrier layer and within one or more of the pre-patterned features and a conductive via may be formed in at least one of the pre-patterned features.

15 Claims, 11 Drawing Sheets

(51) Int. Cl.
*H01L 23/528* (2006.01)
*H01L 23/532* (2006.01)
*G03F 7/00* (2006.01)
*G03F 7/16* (2006.01)
*H01L 21/027* (2006.01)

(52) U.S. Cl.
CPC .... *H01L 21/0271* (2013.01); *H01L 21/76808* (2013.01); *H01L 21/76825* (2013.01); *H01L 21/76831* (2013.01); *H01L 21/76897* (2013.01); *H01L 23/528* (2013.01); *H01L 23/5226* (2013.01); *H01L 23/5329* (2013.01)

(56) References Cited

U.S. PATENT DOCUMENTS

| | | |
|---|---|---|
| 2002/0048944 A1 | 4/2002 | Tang et al. |
| 2002/0081834 A1 | 6/2002 | Daniels |
| 2013/0127021 A1 | 5/2013 | Millward |
| 2013/0260559 A1 | 10/2013 | Park et al. |
| 2014/0048944 A1 | 2/2014 | Lin et al. |
| 2014/0183737 A1 | 7/2014 | Zhang et al. |
| 2014/0206186 A1 | 7/2014 | Lee et al. |

OTHER PUBLICATIONS

European Patent Application No. 14909261.1, dated Aug. 24, 2018, 7 pages.
International Preliminary Search Report for PCT/US2014/072387 dated Jul. 6, 2017, 6 pages.

MATERIALS AND DEPOSITION SCHEMES USING PHOTOACTIVE MATERIALS FOR INTERFACE CHEMICAL CONTROL AND PATTERNING OF PREDEFINED STRUCTURES

CROSS-REFERENCE TO RELATED APPLICATION

This patent application is a U.S. National Phase Application under 35 U.S.C. § 371 of International Application No. PCT/US2014/072387, filed Dec. 24, 2014, entitled MATERIALS AND DEPOSITION SCHEMES USING PHOTOACTIVE MATERIALS FOR INTERFACE CHEMICAL CONTROL AND PATTERNING OF PREDEFINED STRUCTURES.

TECHNICAL FIELD

Embodiments of the invention are in the field of semiconductor structures and processing and, in particular, self-aligned via patterning for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

DESCRIPTION OF THE EMBODIMENTS

Figure 1A:
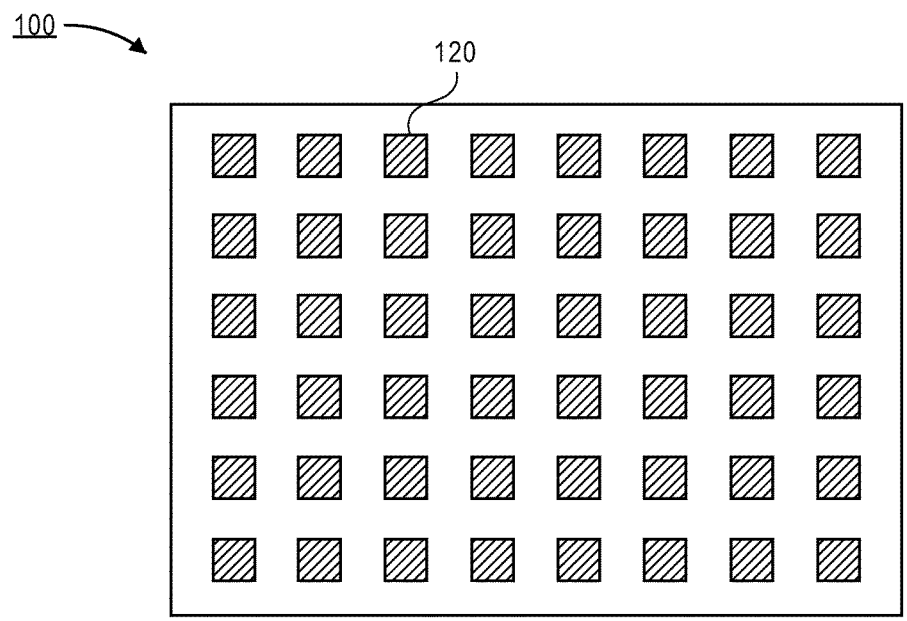
FIG. 1A illustrates a schematic plan view of an interconnect layer that includes a plurality of pre-patterned features, in accordance with an embodiment of the invention.

Described herein are systems that include a substrate with multiple layers with varying compositions and methods of depositing and patterning such layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

As described above, continued scaling of devices has necessitated that the critical dimension and the pitch of via openings formed in an interconnect layer decrease beyond the traditional capabilities of standard BEOL processing equipment. To overcome the limitations of the existing processing equipment, embodiments of the invention may utilize an interconnect layer 100 that comprises a plurality of pre-patterned features 120. Such an interconnect layer 100 is illustrated in the plan view shown in FIG. 1A. In the illustrated embodiment, the pre-patterned features 120 may be formed at regular intervals over the interconnect layer 100. In the illustrated embodiment, the pre-patterned features 120 are substantially square, though embodiments are not limited to such configurations.

According to an embodiment, pre-patterned features 120 may be formed at every potential location where a via could possibly be formed. A photoresist material may then be deposited into each of the pre-patterned features 120 and the desired locations for the vias may be selectively patterned. Since the photoresist is confined in each pre-patterned feature 120, BEOL lithography equipment does not need to have the capability to resolve the critical dimension of the via. Additionally, the photoresist material does not need to be optimized to produce the desired LWR or CDU characteristics since the pre-patterned features define the pattern of the vias. As such, high dosages that are typically needed for roughness control when developing a photoresist material may be reduced. Therefore, the pre-patterned feature approach may be used to circumvent imaging/dose tradeoff which limits the throughput of next generation lithographic processes.

Figure 1B:
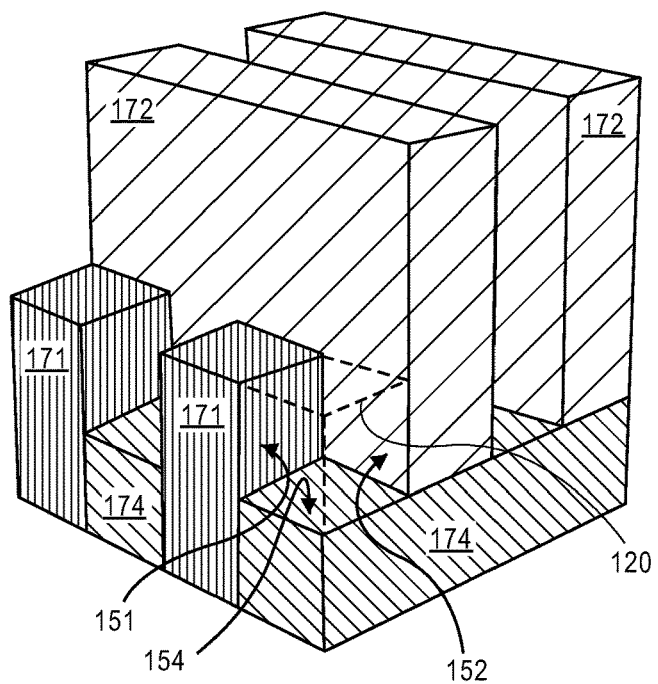
FIG. 1B illustrates a perspective view of an interconnect layer that includes a plurality of pre-patterned features, in accordance with an embodiment of the invention.

The plan view of the interconnect layer 100 in FIG. 1A is depicted as being formed with a single material in order to not unnecessarily obscure the invention. However, according to additional embodiments, the interconnect layer 100 may be formed from multiple materials. An exemplary illustration of how multiple materials may be used to form the pre-patterned features 120 in an interconnect layer 100 is shown in the perspective view of a portion of an interconnect layer 100 illustrated in FIG. 1B. For example, three different materials are illustrated in FIG. 1B. According to an embodiment of the invention, one or more of the materials may be patterned to form a cross-grating. For example, a grating pattern in a first layer 171 may be oriented perpendicular to a grating pattern in a second layer 172 in order to form the cross-grating pattern. A floor layer 174 may be formed in spaces between the cross-grating pattern formed by the first layer 171 and the second layer 172. Together, the layers may define the pre-patterned feature 120. For example, a first wall 151 of the pre-patterned feature may be defined by a portion of the first layer 171, a second wall 152 of the pre-patterned feature may be defined by a portion of the second layer 172, and a floor 154 of the pre-patterned feature may be defined by a portion of the floor layer 174.

Embodiments of the invention may form tightly pitched features that exceed the limits of the BEOL lithography equipment by using a spacer-etching process to form the grating pattern in each layer. Representatively, first sacrificial structures may be formed over a first unpatterned layer 171. The first sacrificial structures may have a pitch and a critical dimension that may be produced by the BEOL lithography equipment. First spacers may then be formed along the sidewalls of the first sacrificial structures. The first sacrificial structures may then be etched away, leaving behind the first spacers. Since two spacers are formed for each sacrificial structure, the spacers may have a pitch that is half the pitch of the sacrificial structures. According to an embodiment, the pitch may optionally be halved again by forming an additional set of spacers along the sidewalls of the first spacers. The pattern of the first spacers may then be transferred into the first unpatterned layer with an etching process, using the first spacers as a mask layer to form the first grating pattern. Next, the second layer 172 may then be deposited over the first grating structure. Thereafter, the spacer-etching process may be repeated with second sacrificial structures and second spacers that are oriented orthogonally to the first grating pattern in order to produce the cross grating pattern illustrated in FIG. 1B.

In an embodiment, each of the layers used to form the interconnect layer 100 may be different materials. For example, the first layer 171 and the second layer 172 may be comprised of one or more materials used in semiconductor fabrication processes, such as, for example, Si, α-Si, oxides (e.g., SiO, TiO, AlO, etc.), nitrides (e.g., SiN, TiN, SiON, TaN, etc.), carbides (e.g., SiC, SiOC, carbon hardmask, etc.). For example, these materials may be formed with various processes, such as spin-on coating, CVD, PVD, ALD, or the like. Various wet cleans may also accompany the etching processes. In general, a final wet clean may be done on the substrate prior to the deposition of the photoresist into the pre-patterned features 120. In an embodiment, the floor layer 174 may be a conductive material, such as a metal contact or an interconnect line of a lower interconnect layer. By way of example, the interconnect line may be copper, tungsten, or any other conductive material used in interconnect lines. Alternatively, the floor layer 174 may be a dielectric material according to an embodiment.

In embodiments, the interconnect layer 100 may be formed directly over a semiconducting substrate, such as a silicon substrate, a III-V semiconductor substrate, or the like. Embodiments may include a semiconducting substrate that includes integrated circuitry. Vias and contacts that are formed on and/or through the interconnect layer 100 may provide electrical contacts to the integrated circuitry. According to an additional embodiment, one or more additional interconnect layers may separate the interconnect layer 100 from a semiconducting substrate. In such embodiments, conductive lines and vias formed on or through the interconnect layer 100 may provide electrical connections to contact lines and vias formed in the additional interconnect layers formed below the interconnect layer 100.

Figure 1C:
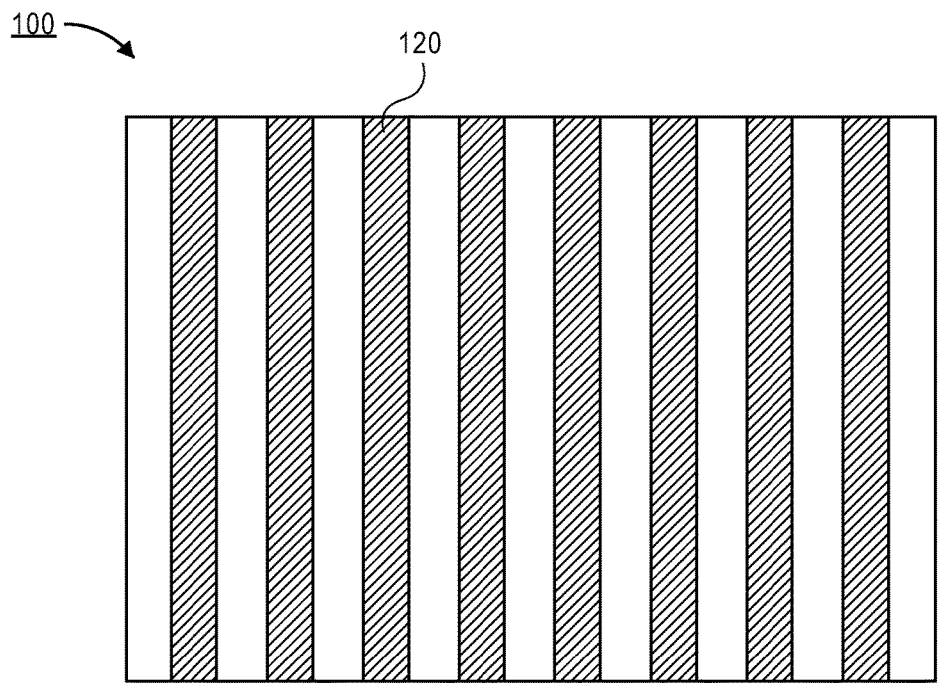
FIG. 1C illustrates a schematic plan view of a substrate layer that includes a plurality of pre-patterned features, in accordance with an additional embodiment of the invention.

While FIGS. 1A and 1B illustrate a plurality of pre-patterned features 120 that are approximately square and defined by a cross-grating pattern of multiple material layers, (i.e., "2D pre-patterned features"), it is to be appreciated that embodiments of the invention are not limited to such configurations. For example, pre-patterned features 120 may also be approximately rectangular in shape and formed with a single grating pattern, (i.e., "1D pre-patterned features"). Pre-patterned features 120 according to such embodiments are illustrated in the schematic plan view shown in FIG. 1C.

Figure 2A:
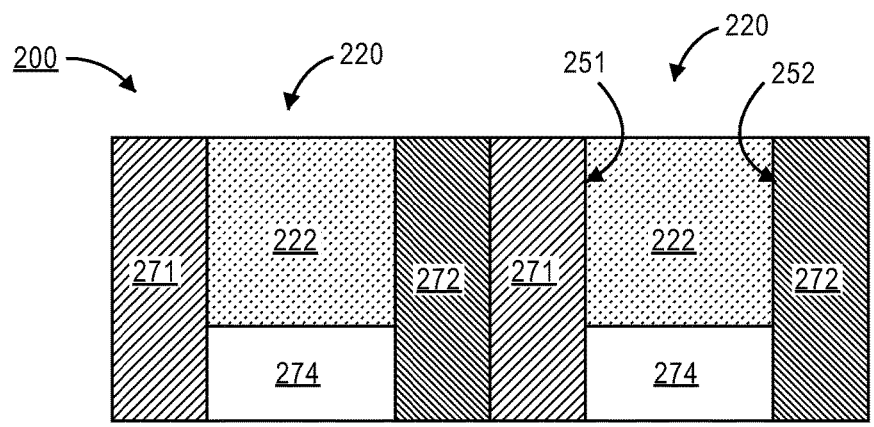
FIG. 2A illustrates a cross-sectional view of pre-patterned features in an interconnect layer that are filled with a photoresist material, in accordance with an embodiment of the invention.
Figure 2B:
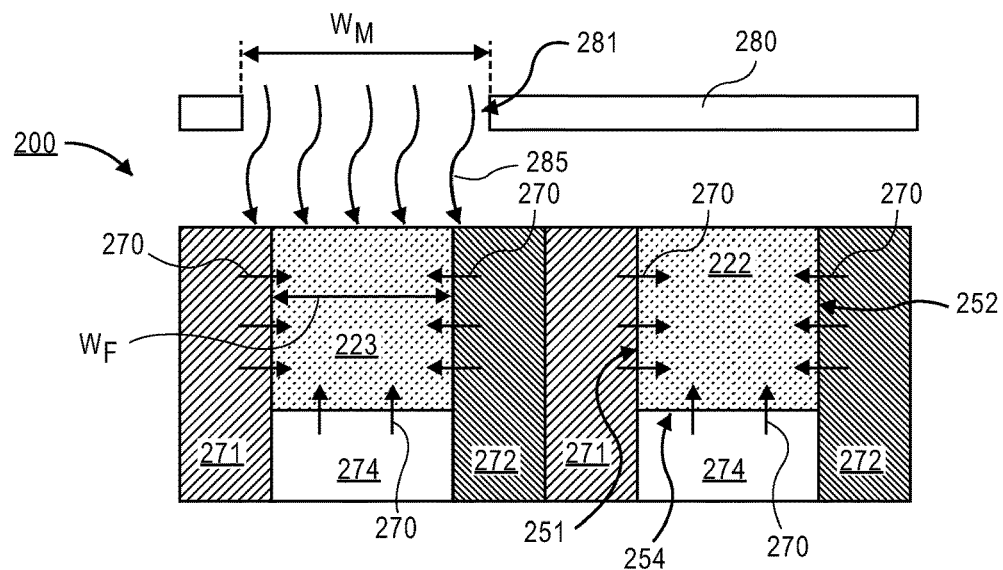
FIG. 2B illustrates a cross-sectional view of pre-patterned features that are filled with a photoresist material and that has been exposed to radiation through a mask, in accordance with an embodiment of the invention.
Figure 2C:
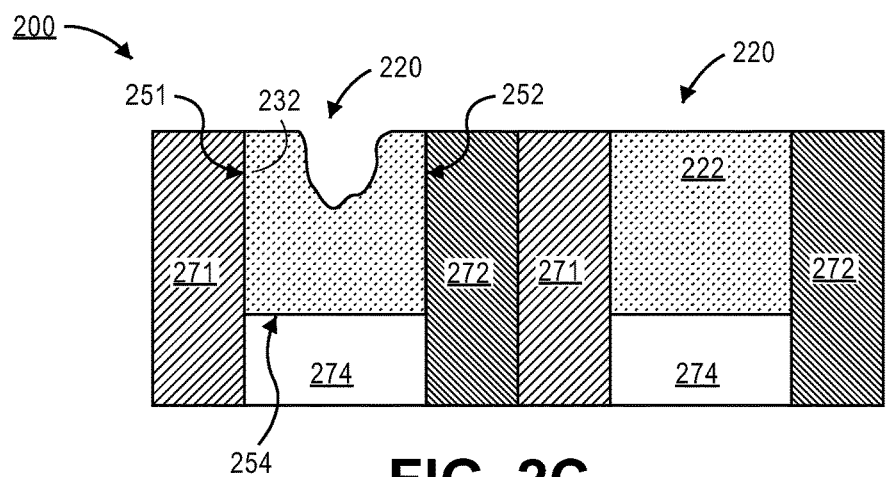
FIG. 2C illustrates a cross-sectional view of an interconnect structure that has suffered substrate poisoning and that has been partially developed, in accordance with an embodiment of the invention.

FIGS. 2A-2C are cross-sectional illustrations that depict a process for forming vias in conjunction with the pre-patterned features. As shown in FIG. 2A, a photoresist material 222 may be disposed into each of the pre-patterned features 220 that are defined by one or more material layers. For example, each of the pre-patterned features 220 may be defined by a first material layer 271, a second material layer 272, and a floor layer 274. In an embodiment, the photoresist material 222 may be spun on. The photoresist may be a positive or a negative photoresist. The photoresist systems used may be compatible with deep ultra violet (DUV) radiation, according to an embodiment. Additional embodiments may also include chemically amplified resist (CAR) systems. In a CAR system, a photoacid generator (PAG) may be included in the resist system. The PAG allows for an acid to be formed upon exposure to a particular wavelength of radiation. For example, in a positive DUV compatible system, radiation that has a 248 nm wavelength may be used to cause the PAG to form an acid. The acid acts as a catalyst in order to "deblock" the blocking group that prevents the resin used for the resist from being soluble in a developer. As such, the areas of the resin that were exposed to the radiation become soluble in a developer. By way of example, the photoresist may be a tert-butyloxycarbonyl protecting group (t-BOC) poly hydroxystyrene (PHS) resin system, an acetal system, an environmentally stable chemically amplified photoresist (ESCAP) system, or the like.

Thereafter, the photoresist material 222 in one or more of the pre-patterned features 220 are exposed with radiation 285 from a radiation source (not shown), as illustrated in FIG. 2B. A mask 280 may be used to shield certain pre-patterned features from the radiation 285 in order to allow for vias to be formed at desired locations. When a positive resist system is used, the opening 281 in the mask is formed where a via is desired, whereas when a negative photoresist system is used, the opening 281 is formed where a via is not desired.

As illustrated, mask openings 281 may have a width $W_M$ that is greater than the width $W_F$ of the pre-patterned feature 220 since the photoresist is confined to the dimensions of the pre-patterned features 220. Accordingly, the resolution capabilities of the lithographic scanners used do not need to be capable of resolving features with the pitch and critical dimension of the pre-patterned features 220. For example, if the mask opening allows for radiation 285 to contact the portions of the interconnect layer 200 that are not within the pre-patterned feature 220, there will not be any patterning, since the materials surrounding the pre-patterned feature 220 are non-photolyzable.

Typically, the radiation source interacts with PAGs to release acidic components that alter the chemistry of the photoresist material 222. As used herein, the photoresist material that has been chemically altered so that it is developable by the developer may be referred to as developable photoresist material 223. For example, the acid may render the photoresist soluble in a developer by deblocking the resin, as described above.

However, some materials that may contact the photoresist material may render the photoresist undevelopable or reduce the effectiveness of the photoresist (e.g., a larger dosage of radiation is needed to develop the photoresist). Such negative interactions between the materials forming the interconnect layer 200 and the photoresist material 222 may be referred to herein as "substrate poisoning". One example of substrate poisoning is when a material used to form a portion of the pre-patterned feature 220 is porous and retains basic chemicals that were used during a cleaning or etching processes. In such a situation, the acids produced by the PAGs of the photoresist may be neutralized by the diffusion of the basic chemicals from the wall or floor materials as indicated by arrows 270 in FIG. 2B. As such, the photoresist may not be soluble in the developer.

By way of example, substrate poisoning may occur when the first and second material layers 271, 272 are a SiOC-based porous ILD material and/or the floor layer 274 is a SiN material. In such embodiments, a final clean of the surface prior to the deposition of the photoresist material 222 into the pre-patterned feature 220 may be an ammonia-based clean. After the photoresist is spun-on, exposed, and baked, the PAGs in the photoresist may be neutralized by the basic chemicals from the ammonia-based clean that diffuse from the porous materials used to form the first and second sidewalls 251, 252 and the floor 254 of the pre-patterned features 220. It is to be appreciated that the presence of substrate poisoning that results from the use of an ammonia-based clean in conjunction with porous materials is used for exemplary purposes. Substrate poisoning may be caused by a variety of different etching chemistries, cleaning chemistries, material selections, or combinations thereof.

Figure 2D:
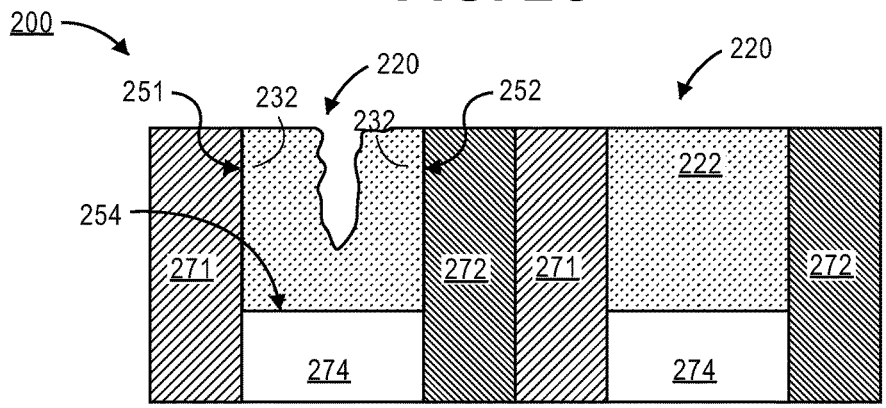
FIG. 2D illustrates a cross-sectional view of an interconnect structure that has suffered substrate poisoning and that has been partially developed, in accordance with an embodiment of the invention.

Examples of the effects of substrate poisoning are illustrated in the cross-sectional views of pre-patterned features 220 shown in FIGS. 2C and 2D. In FIG. 2C, the photoresist material is not fully removed from the sidewalls and floor of each exposed pre-patterned feature after the interconnect lay is developed. As such, residual portions 232 of the photoresist material may be left behind. Since the photoresist cannot be completely removed, subsequent processing operations, such as a metal deposition to form a via to the floor 254 or an etching process through the floor 254, may not be effective.

While residual portions of the photoresist may remain on both sidewalls and the floor of each pre-patterned feature 220, embodiments are not limited to such configurations. For example, FIG. 2D illustrates a pre-patterned feature 220 that includes residual photoresist 232 along the sidewalls. Such situations may occur when one material leaches a substance that quenches an acid formed from the PAGs, whereas the other materials that form the pre-patterned features 220 do not. Depending on the degree of substrate poisoning, the residual portion 232 of the resist may be less than or greater than the amount of residual resist illustrated in the exemplary embodiments described in detail herein. For example, substrate poisoning may result in the photoresist material 222 in a pre-patterned feature 220 being entirely undevelopable.

Due to the negative interactions that may occur between materials that form the sidewalls and floors of the pre-patterned features 220 and the photoresist material 222, a process flow for forming an interconnect structure must be carefully engineered in order to minimize negative interactions. For example, the materials, the etching chemistries, the cleaning chemistries, and the photoresist system may be chosen to minimize negative interactions. However, during the process development cycle, it may be necessary to change one or more of the materials, the processing conditions, and/or the processing operations. These changes result in new materials and potential diffusion species that need to be accounted for in order to prevent or minimize the effects of substrate poisoning. As such, it may be necessary to redesign the photoresist system in order to minimize the effect of substrate poisoning whenever there is a change to the process flow. Furthermore, design rules, material constraints, and/or other process limitations may make it impractical, or even impossible, to prevent negative interactions between the materials used for the pre-patterned features 220 and the photoresist material 222.

Accordingly, embodiments of the invention include forming a bather layer between one or more of the surfaces of the pre-patterned features 220 and the photoresist material 222. The barrier layer prevents substrate poisoning that occurs as the result of diffusion of unwanted compounds that may quench the photo-acids produced by the PAGs. The presence of a barrier layer also allows for changes in the materials used to form the pre-patterned features 220 and/or changes in the chemistries used in the etching and/or cleaning process used to form the pre-patterned features 220 to be implemented during the process development cycle without having to redesign the photoresist system. Furthermore, the presence of a barrier layer may provide an additional site where PAGs may be anchored. As such, the concentration of a photoactive component (e.g., the PAGs) within the photoresist material may be reduced or eliminated. This may be beneficial because solubility limits of the photoresist resin may limit the concentration of the photoactive compound that may be present in the photoresist material. For example, including additional PAGs in the barrier layer may reduce the dose to clear the photoresist material by two-thirds or greater. Accordingly, the throughput may be significantly increased according to embodiments of the invention.

Figure 3A:
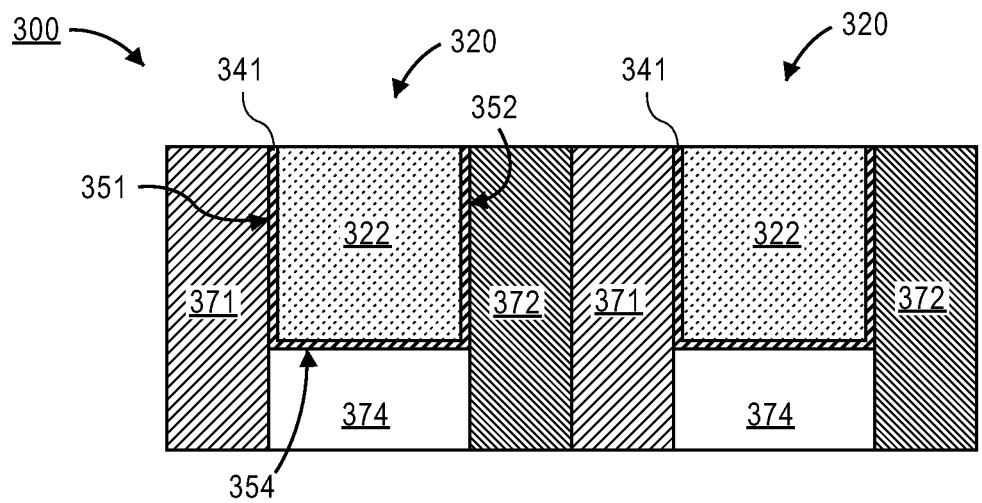
FIG. 3A illustrates a cross-sectional view of an interconnect layer that has pre-patterned features that are lined by a conformal barrier layer, in accordance with an embodiment of the invention.

Referring now to FIG. 3A, a cross-sectional illustration of pre-patterned features 320 formed into an interconnect layer 300 is shown. According to an embodiment, the interconnect layer 300 may include one or more different materials. For example, each surface of the pre-patterned features 320 illustrated in FIG. 3A is formed from a different material. As illustrated, the first sidewall 351, the second sidewall 352, and the floor 354 are formed with a first material layer 371, a second material layer 372, and a floor material layer 374, respectively. While the pre-patterned feature 320 is illustrated as having surfaces with three different materials, embodiments of the invention are not limited to such configurations. For example, the first and second sidewalls 351, 352 may be formed from the same material. Additional embodiments may also include a floor material layer 374, a first material layer 371, and a second material layer 372 that are formed from the same material. According to an embodiment, the floor material layer 374, and the first and second material layers 371, 372 may be common materials used in semiconductor fabrication processes, such as, for example, Si, α-Si, oxides (e.g., SiO, TiO, AlO, etc.), nitrides (e.g., SiN, TiN, SiON, TaN, etc.), carbides (e.g., SiC, SiOC, carbon hardmask, etc.), or the like. In an embodiment, the floor material layer 374 may be a conductive material, such as a metal contact or an interconnect line of a lower interconnect layer. By way of example, the interconnect line may be copper, tungsten, or any other conductive material used in interconnect lines.

In an embodiment, a conformal bather layer 341 may be formed over one or more of the exposed surfaces of the pre-patterned feature 320. As illustrated in FIG. 3A, the barrier layer 341 is a conformal layer that is formed over all of the surfaces of the pre-patterned feature 320. While illustrated as a continuous layer, embodiments may also include barrier layers such as self-assembled monolayers (SAMs) or polymer brush layers (both described in greater detail below) that may not necessarily cover the entire physical surface of the pre-patterned feature 320. However it is to be appreciated that the molecules forming the SAM or polymer brush are formed over the surfaces to a density sufficient to substantially eliminate the diffusion of species from the surfaces of the pre-patterned features 320 into the photoresist material. In an embodiment, the thickness of the barrier layer 341 may be less than approximately 5 nm. In an embodiment, the thickness of the barrier layer 341 may be between approximately 2 nm and approximately 3 nm. Certain embodiments may include a barrier layer 341 that has a thickness that is less than 1 nm.

Figure 3B:
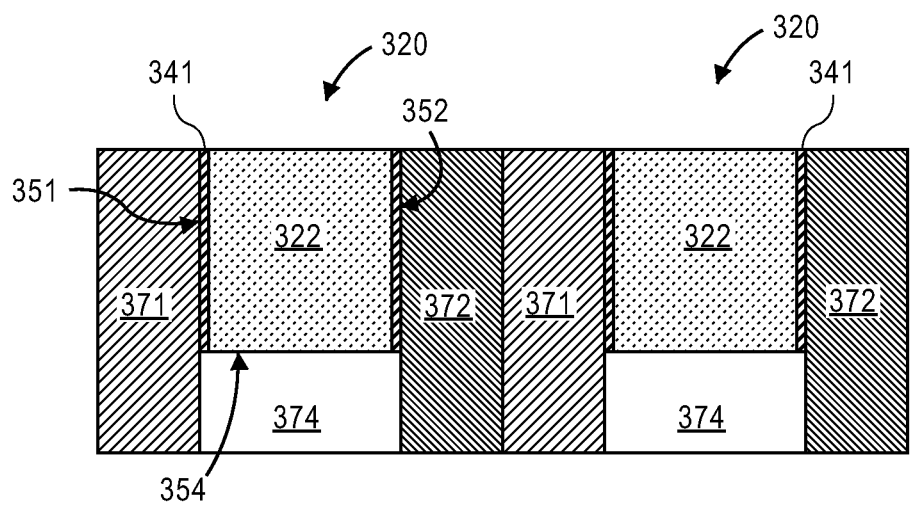
FIG. 3B illustrates a cross-sectional view of an interconnect layer that has pre-patterned features with sidewalls lined by a conformal barrier layer, in accordance with an embodiment of the invention.

In an additional embodiment, the barrier layer may be selectively formed over one or more surfaces of the pre-patterned feature 320. For example, the barrier layer may be selectively formed over surfaces that are likely to cause substrate poisoning. FIG. 3B is a cross-sectional illustration of such an embodiment. In FIG. 3B the floor 354 is not covered by a barrier layer 341. In an embodiment, the barrier layer 341 may be selectively formed over the sidewalls and omitted from the floor because the floor 354 is a material that does not interact with the barrier layer 341 to form a bond.

Referring now to FIGS. 4A-4G a process for patterning photoresist material 422 deposited in the pre-patterned feature 420 that includes a SAM barrier layer 441 is illustrated according to an embodiment of the invention. As illustrated in FIGS. 4A-4G, each molecule in the SAM barrier layer 441 is schematically illustrated as having a head group 461 and a chain 462. The head group 461 is a functional group that may be selected so that the SAM barrier layer is selectively formed on surfaces that may cause negative interactions with the photoresist material. The chain 462 may be any suitable alkyl chain known in the art. In certain embodiments, the head group 461 may be a silane based molecule. Silane based molecules may be used to selectively form the SAM barrier layer 441 because the silane head group 461 readily reacts with hydroxyl groups on the surface of various interlayer dielectric materials to form covalent bonds. By way of example, the head group 461 may be one or more of alkoxysilanes, aminosilanes, halogen-terminated silanes, and the like. FIGS. 5A-5F illustrate several exemplary SAMs that may be utilized in embodiments of the invention. In FIGS. 5A-5F "X" may be a halogen, such as Cl, Br, I, etc. and "R" may be CH3-, CH2CH2-, etc.

Figure 4A:
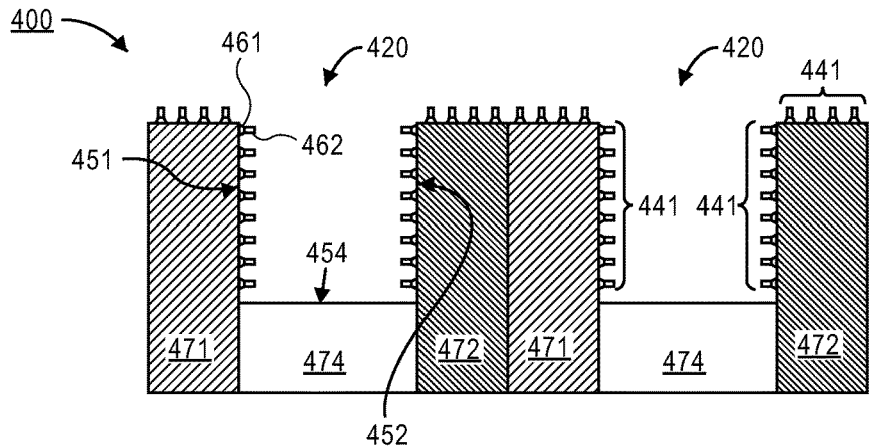
FIGS. 4A-4G illustrate a cross-sectional view of a process for forming conductive vias in pre-patterned features that are lined with a conformal barrier layer that is a self-assembled monolayer (SAM), in accordance with an embodiment of the invention.

Referring now to the cross-sectional illustration in FIG. 4A, a SAM barrier layer 441 has been selectively deposited over the interconnect layer 400, according to an embodiment of the invention. As illustrated, the barrier layer 441 may be selectively deposited over surfaces that are sources of substrate poisoning. For example, the barrier layer 441 may be formed over the first sidewall 451 and the second sidewall 452 of the pre-patterned feature 420, and the floor 454 is not covered by the barrier layer 441. In an embodiment, the barrier layer 441 may optionally be omitted from the floor because it is not a source of substrate poisoning. For example, the floor may be a metallic material. However, embodiments are not limited to such configurations, and embodiments may include a SAM barrier layer 441 that is also formed over the floor of the pre-patterned feature 420.

According to embodiments of the invention, the SAM barrier layer 441 may be deposited over the interconnect layer 400 with processes such as spin-coating, vapor phase deposition, solution phase deposition (e.g., soaking), or the like. Additional embodiments may also include heating the interconnect layer 400 to provide additional energy to the system to assist in the formation of covalent bonds between the head group 461 and the surfaces of the pre-patterned features 420. For example, the interconnect layer 400 may be heated from between room temperature to approximately 250° C., according to an embodiment.

Figure 4B:
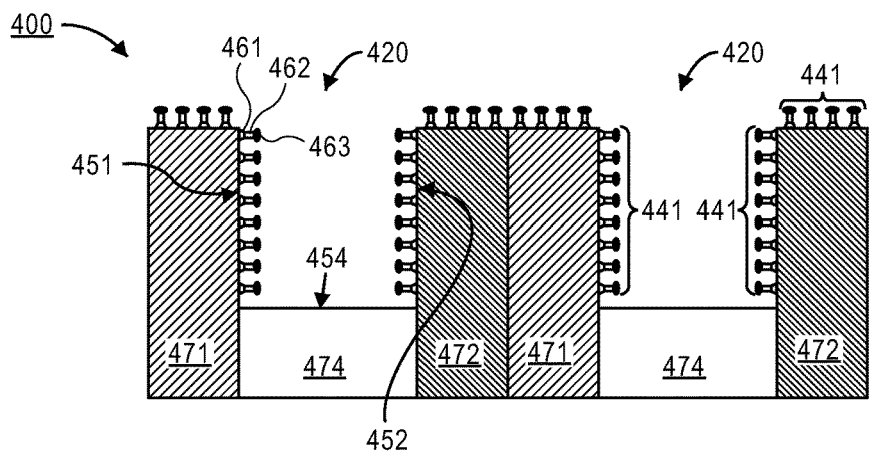

In an embodiment, PAGs 463 may optionally be synthesized onto the chains 462 of the SAM barrier layer 441, as illustrated in FIG. 4B. The PAGs 463 may be any PAG compound that includes a synthetic route to attach the PAG to the chain 662. By way of example, the PAG may be tri-sulfonium triflate, bi-sulfonium triflate, mono-sulfonium triflate, diphenyl iodonium triflate, or any other known PAG molecule. The use of a PAG functionalized SAM barrier layer 441 allows for more flexibility in the design of the photoresist material. The presence of the PAGs on the barrier layer 441 allows for the concentration of PAGs in the photoresist material to be reduced. In an embodiment, the PAGs may be completely removed from the photoresist material. As such, problems in the design of the photoresist system attributable to the solubility limits of the PAGs in the photoresist resin may be avoided.

According to an embodiment, the PAGs may be synthesized onto the chains 462 prior to forming the SAM barrier layer 441 over the surfaces of the pre-patterned features 420. In an additional embodiment, the PAGs 463 may be synthesized onto the chains 462 after the SAM barrier layer 441 including the head group 461 and the chain 462 are formed on the surfaces of the pre-patterned features 420. While embodiments of the invention described in detail herein include the presence of a PAG functionalized SAM barrier layer 441, embodiments of the invention are not limited to such configurations. According to additional embodiments, a SAM barrier layer 441 that is not functionalized with PAGs may also allow for the reduction or elimination of substrate poisoning. In such embodiments, the PAG may be present in the photoresist material only.

Figure 4C:
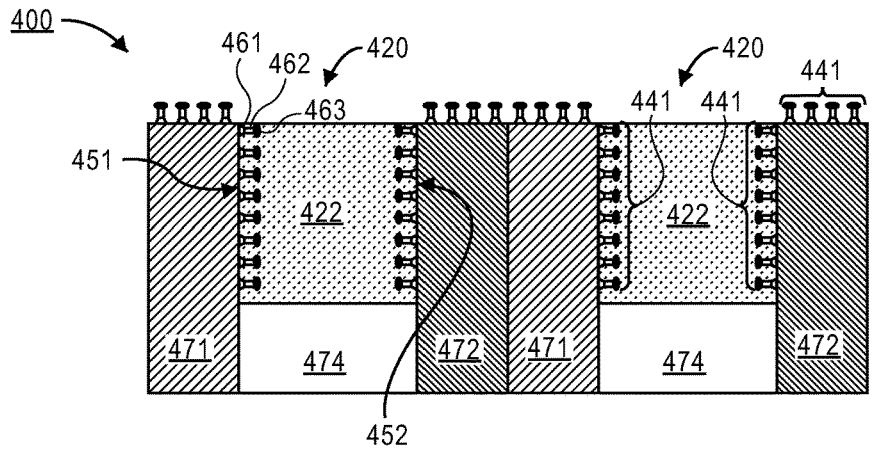

Referring now to FIG. 4C, a photoresist material 422 may be deposited over the interconnect layer 400. As illustrated, the deposited photoresist material fills the pre-patterned features 420. By way of example, the photoresist material 420 may be deposited with a spin-coating process. The presence of the barrier layer 441 prevents the diffusion of compounds from the surfaces of the pre-patterned feature 420 into the deposited photoresist material 422.

The photoresist systems used may be compatible with DUV radiation, according to an embodiment. Additional embodiments may also include CAR systems. By way of example, the photoresist may be a t-BOC PHS resin system, an acetal system, an ESCAP system, or the like. While embodiments of the invention illustrate the use of a positive photoresist system, it is to be appreciated that a negative photoresist system may also be used according to embodiments of the invention.

Figure 4D:
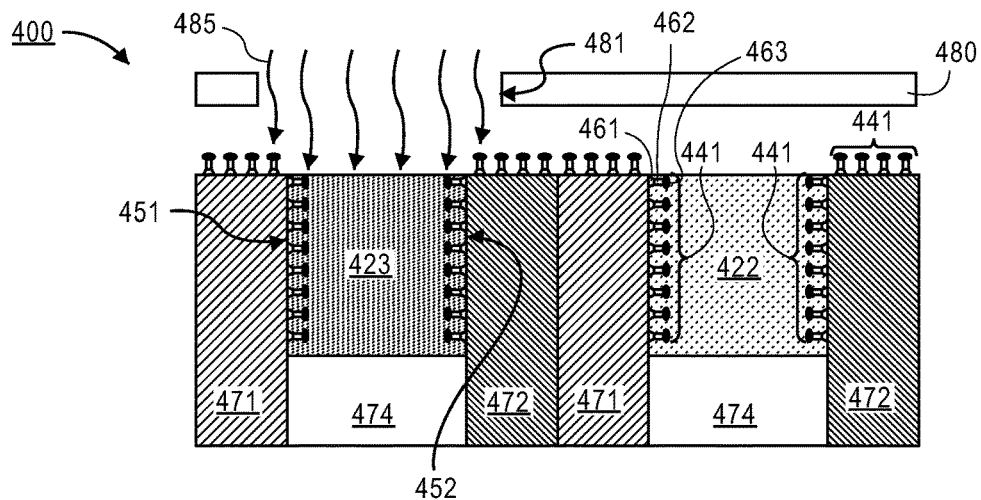

Referring now to FIG. 4D, the portions of the interconnect layer 400 where a via is desired are exposed to radiation 485 from a radiation source (not shown). As illustrated, a mask 480 may be utilized to block the radiation from exposing pre-patterned features 420 where a via is not desired. By way of example, radiation from an electron-beam lithography tool or an EUV compatible system (e.g., a system that produces radiation with a 13.5 nm wavelength) may be used to cause the PAGs 463 of the SAM barrier layer 441 and/or the PAGs within the photoresist material 442 to "deblock" the blocking group and render the resin soluble in the developer (i.e., developable photoresist material 423).

Figure 4E:
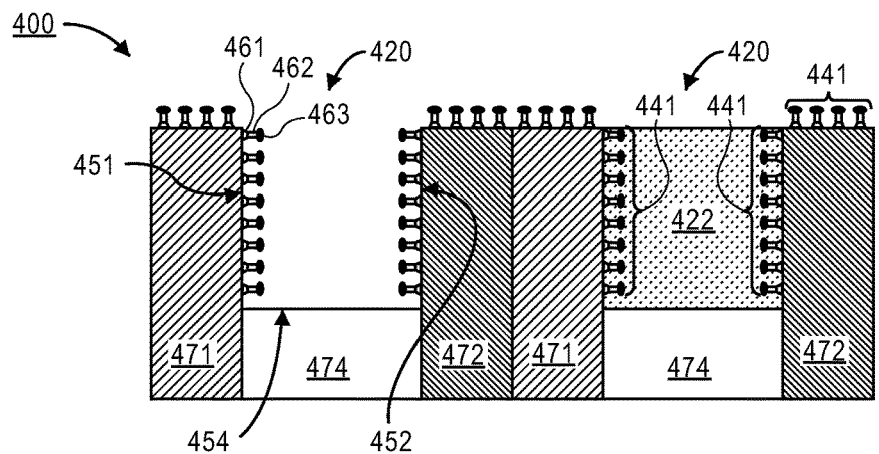

Referring now to FIG. 4E, the interconnect layer 400 is exposed to a developer and developable photoresist material 423 is removed. The developer may be any known developer, such as, for example, a TMAH developer. In an embodiment, the SAM barrier layer 441 may remain in the pre-patterned features 420 in which the developable photoresist material 423 has been removed. Accordingly, embodiments of the invention may also include a process to remove the barrier layer 441. By way of example, the SAM barrier layer 441 may be removed with a high temperature burn off process or an ashing process subsequent to the removal of the developable photoresist material 423.

Figure 4F:
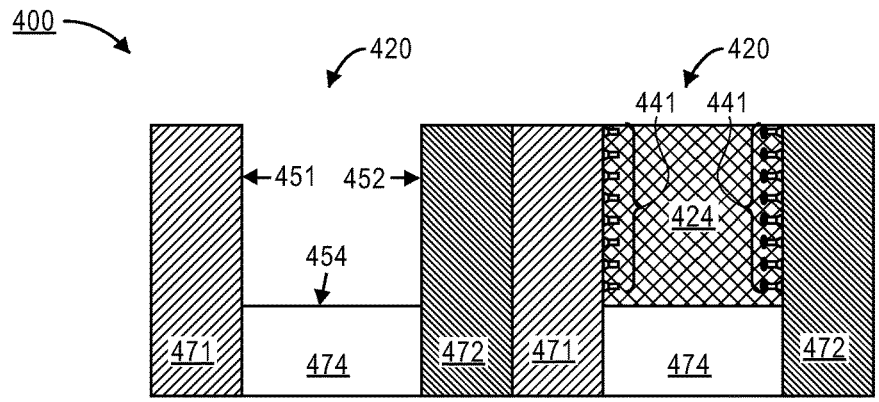

In an embodiment, the unexposed photoresist material 422 remains after the interconnect layer 400 is developed. The unexposed photoresist material 422 remaining in pre-patterned features 420 may be modified so that it becomes a stable interlayer dielectric material, as illustrated in FIG. 4F. As used herein the modified photoresist material 422 may be referred to as photoresist 424. For example, the unexposed photoresist may be cross-linked with a baking operation. In one such embodiment, the cross-linking provides for a solubility switch upon the baking. In an embodiment the cross-linked material has inter-dielectric properties and, may be retained in a final metallization structure.

Figure 4G:
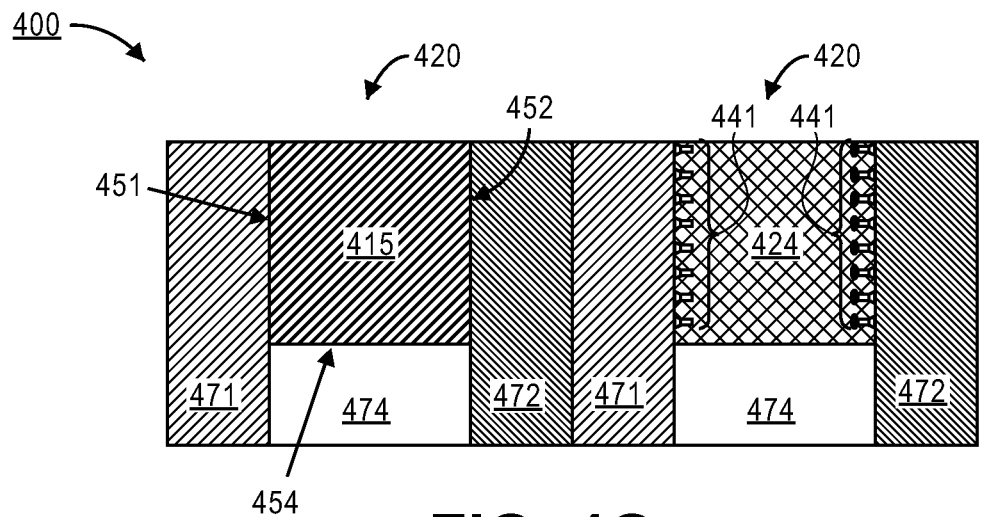

Referring now to FIG. 4G, a conductive layer may be deposited into the exposed pre-patterned features 420 to form vias 415, according to an embodiment. Such an embodiment may be useful when the floor is a contact or an interconnect line in a lower interconnect level. In an alternative embodiment, the floor may be etched through prior to depositing a conductive layer in order to expose a contact to a lower interconnect layer. For example, an etchstop layer (not shown) may be formed over a contact to a lower level.

Figure 4H:
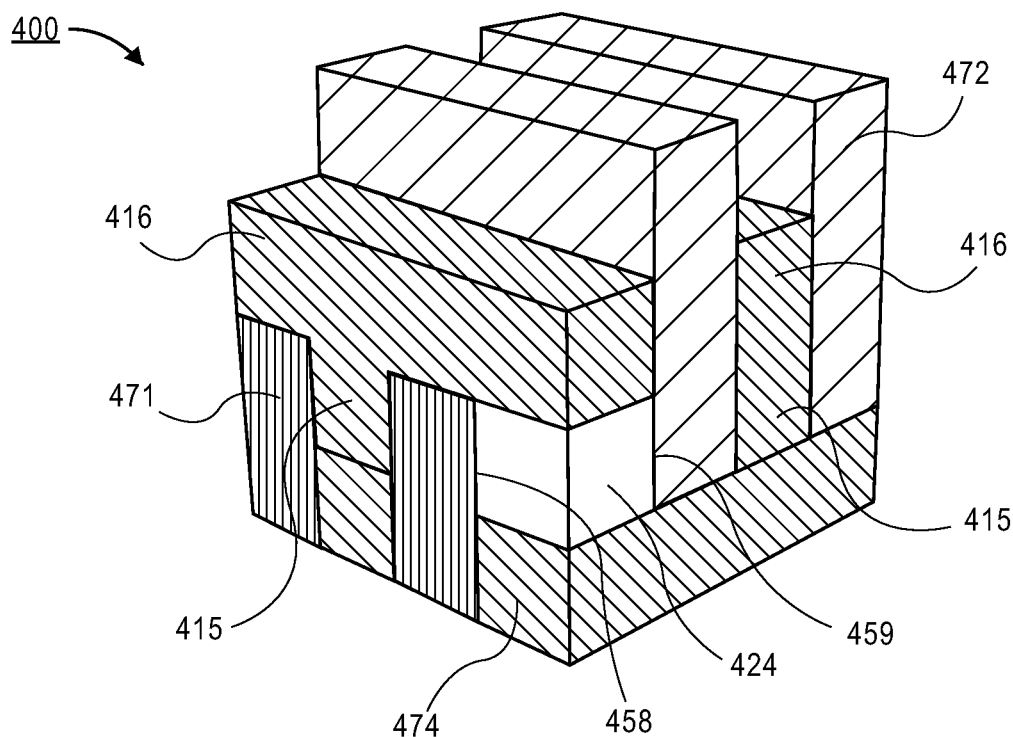
FIG. 4H illustrates a perspective view of the interconnect layer illustrated in FIG. 4G.
Figure 5A:
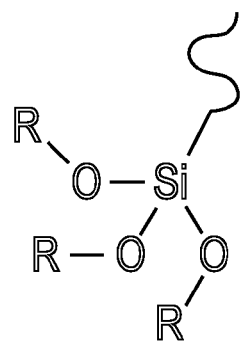
FIGS. 5A-5F illustrate chemical formulas of exemplary head groups that may be used to form the SAM illustrated in FIGS. 4A-4H, in accordance with an embodiment of the invention.
Figure 5B:
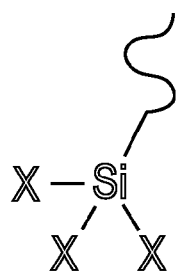
Figure 5C:
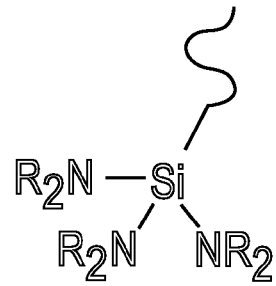
Figure 5D:
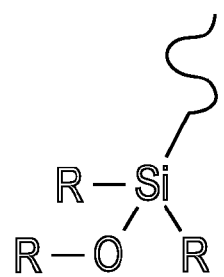
Figure 5E:
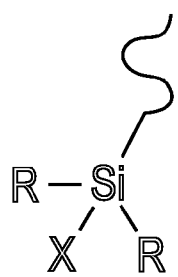
Figure 5F:
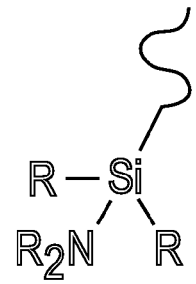

The resulting structure illustrated in FIG. 4G is shown in a perspective view in FIG. 4H in order to more clearly illustrate certain aspects of the interconnect layer 400. The conformal barrier layer 441 is omitted from FIG. 4H in order to more clearly illustrate certain aspects of the interconnect layer 400. In an embodiment, the conductive layer may also extend above the pre-patterned features 420 and extend over the top surfaces of neighboring photoresist material 424 to from an interconnect line 416. Accordingly, the via 415 allows for a contact to be made through the interconnect layer 400 from an interconnect line 416, to a contact on a lower level. As illustrated, the resulting structure may include up to three different dielectric material regions (i.e., the first material layer 471, the second material layer 472, and the photoresist 424), according to an embodiment. In one such embodiment, two or more of the first material layer 471, the second material layer 472, and the photoresist 424 are composed of a same material. In another such embodiment, the first material layer 471, the second material layer 472, and the photoresist 424 are all composed of different ILD materials. Accordingly, in certain embodiments, a vertical seam 458 between the first material layer 471 and the photoresist 424, and/or a vertical seam 459 between the second material layer 472 and the photoresist 424, and/or a vertical seam (not visible in FIG. 4H) between the first material layer 471 and the second material layer 472 may be observed in the final structure. According to an additional embodiment, the conformal barrier layer 441 may separate the photoresist 424 from the first material layer 471 and the second material layer 472. In such embodiments, a vertical seam between the first material layer 471 and the conformal barrier layer 441, and/or a vertical seam between the second material layer 472 and the conformal barrier layer 441 may be observed in the final structure.

According to an additional embodiment, the barrier layer may be a polymer brush barrier layer. In such an embodiment, the barrier layer may be formed of a plurality of polymer chains 665 that are each anchored to the exposed surfaces of the pre-patterned features. According to an embodiment, the molecular weight of the polymer brush may be approximately 10K or less. The polymer chains 665 used to form the polymer brush bather layer may be any polymer chain 665 that can be end-functionalized to bond with the surfaces of the interconnect layer. In an embodiment, monomers used to form the polymer chain may include styrenic monomers, acrylic monomers, methacrylic monomers and its derivatives, or the like. By way of example, the monomers used to form the polymer chains 665 may include methyl acrylate (MA), N,N-dimethylacrylamide (DMA), N,N-dimethylamino ethyl methacrylate (DMAEMA), styrene, methyl methacrylate (MMA), or the like. The polymer chains 665 extend outward from the exposed surfaces and provide a barrier to diffusion between the materials forming the interconnect layer a photoresist material that will be formed over the polymer brush barrier layer in a subsequent process. A process for using such a polymer brush barrier layer is illustrated with respect to FIGS. 6A-6C.

Figure 6A:
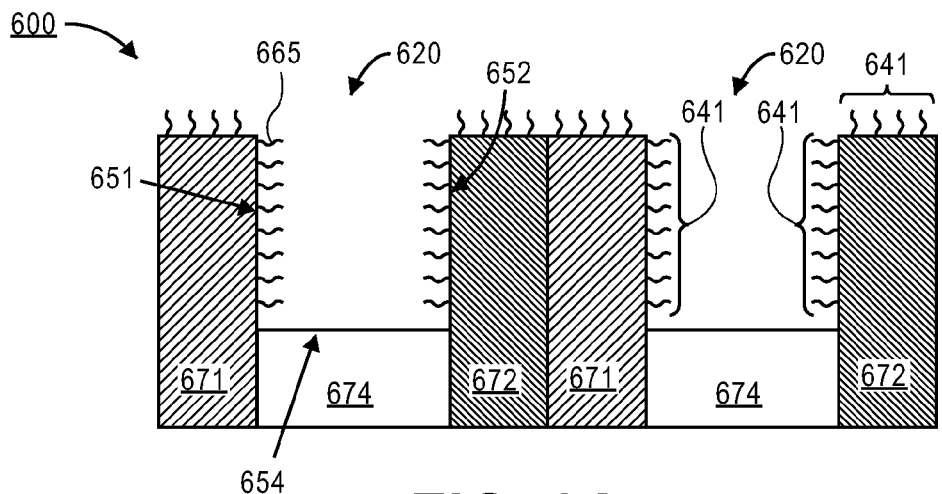
FIGS. 6A-6C illustrate a cross-sectional view of a process for forming conductive vias in pre-patterned features that are lined with a conformal barrier layer that is a polymer brush, in accordance with an embodiment of the invention.

Referring now to the cross-section illustration in FIG. 6A, polymer chains 665 of the polymer brush barrier layer 641 are selectively deposited over the surfaces of the interconnect layer 600, according to an embodiment of the invention. As illustrated, the polymer brush barrier layer 641 may be selectively deposited over surfaces that are sources of substrate poisoning. For example, the polymer brush barrier layer 641 may be formed over the first sidewall 651 and the second sidewall 652 of the pre-patterned feature 620, and the floor 654 is not covered by the polymer brush barrier layer 641. In an embodiment, the polymer brush barrier layer 641 may optionally be omitted from the floor because it is not a source of substrate poisoning. For example, the floor may be a metallic material. However, embodiments are not limited to such configurations, and embodiments may include a polymer brush barrier layer 641 that is also formed over the floor of the pre-patterned feature 620 in addition to one or more of the sidewalls.

According to an embodiment, the polymer chains 665 may be end-functionalized to selectively form a covalent bond to materials that may cause substrate poisoning. By way of example, the end-functionalization of the polymer chain may include functional groups such as hydroxyl, carboxyl, halogen, vinyl, thiol, phosphonic acid, amino, or alkyne groups. According to an additional embodiment, one or more functional groups may be distributed along the length of the polymer chain. In such an embodiment, a solution containing the end-functionalized polymer chains 665 may be spun-on over the surface of the interconnect layer 600. Heat may optionally be applied to the interconnect layer 600 in order to provide enough energy to allow for chains to covalently bond to the surfaces of the interconnect layer 600. Thereafter, excess material from the spun on solution may be rinsed from the interconnect layer 600, leaving behind only the polymer chains 665 that were covalently bonded to the surfaces of the interconnect layer 600.

Figure 6B:
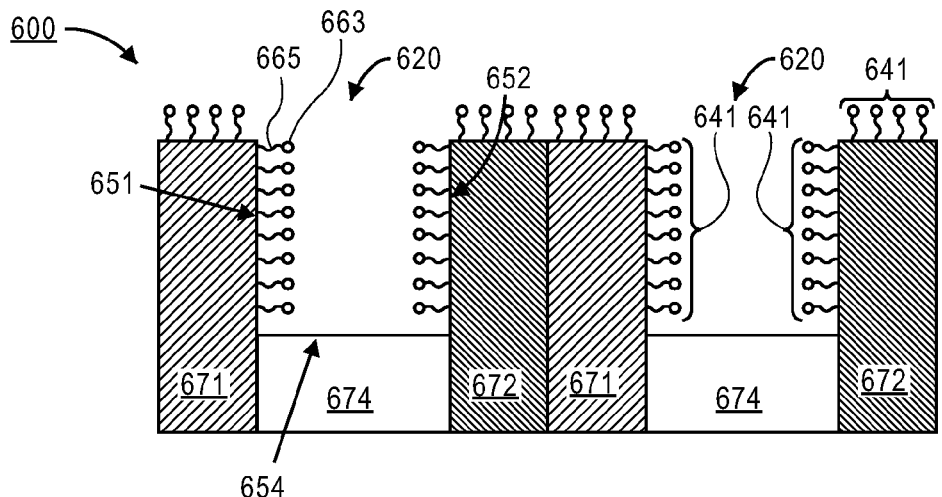

Referring now to FIG. 6B, PAGs 663 may optionally be synthesized onto the polymer chains 665 of the polymer brush barrier layer 641, as illustrated in FIG. 6B. The PAGs 663 may be any PAG compound that includes a synthetic route to attach the PAG to the polymer chain 665. By way of example, the PAG may be tri-solfonium triflate, bi-solfonium triflate, mono-solfonium triflate, diphenyl iodonium triflate, or any other known PAG molecule. The use of a PAG functionalized polymer brush barrier layer 641 allows for more flexibility in the design of the photoresist material. The presence of the PAGs on the polymer brush barrier layer 641 allows for the concentration of PAGs in the photoresist material to be reduced. In an embodiment, the PAGs may be completely removed from the photoresist material. As such, problems in the design of the photoresist system attributable to the solubility limits of the PAGs in the photoresist resin may be avoided.

According to an embodiment, the PAGs may be synthesized onto the polymer chains 665 prior to forming the polymer brush barrier layer 641 over the surfaces of the pre-patterned features 620. In an additional embodiment, the PAGs 663 may be synthesized onto the polymer chains 665 after the polymer brush barrier layer 641 is formed on the surfaces of the pre-patterned features 620. While embodiments of the invention described in detail herein include the presence of a PAG functionalized polymer brush barrier layer 641, embodiments of the invention are not limited to such configurations. According to additional embodiments, a polymer brush barrier layer 641 that is not functionalized with PAGs may also allow for the reduction or elimination of substrate poisoning. In such embodiments, the PAG may be present in the photoresist material only.

Figure 6C:
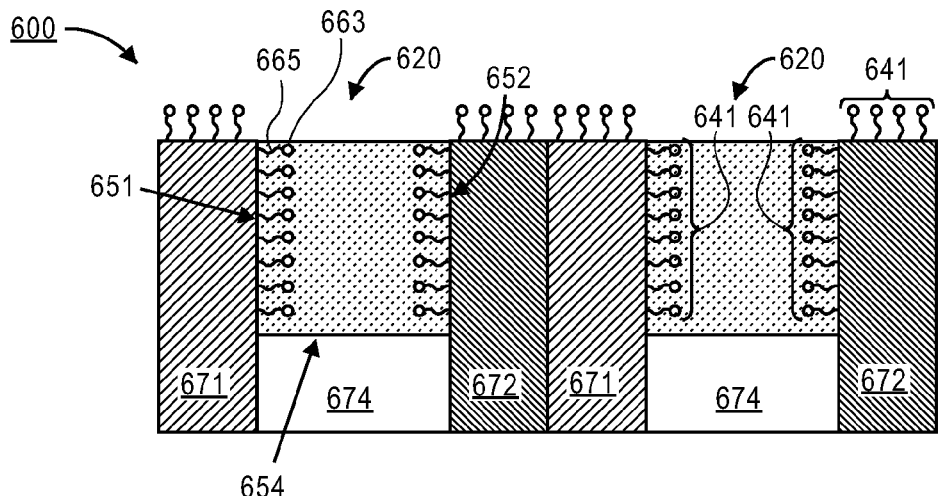

Referring now to FIG. 6C, a photoresist material 622 may be deposited over the interconnect layer 600. As illustrated, the deposited photoresist material fills the pre-patterned features 620. By way of example, the photoresist material 620 may be deposited with a spin-coating process. The presence of the barrier layer 641 prevents the diffusion of compounds from the surfaces of the pre-patterned feature 620 into the deposited photoresist material 622. Accordingly, pre-patterned features 620 where vias are desired may be patterned without interference from substrate poisoning. Accordingly, the process of forming an interconnect line that is connected to a contact on a lower level may continue in substantially the same manner as described above with respect to FIGS. 4D-4H, and as such will not be repeated herein.

Figure 7:
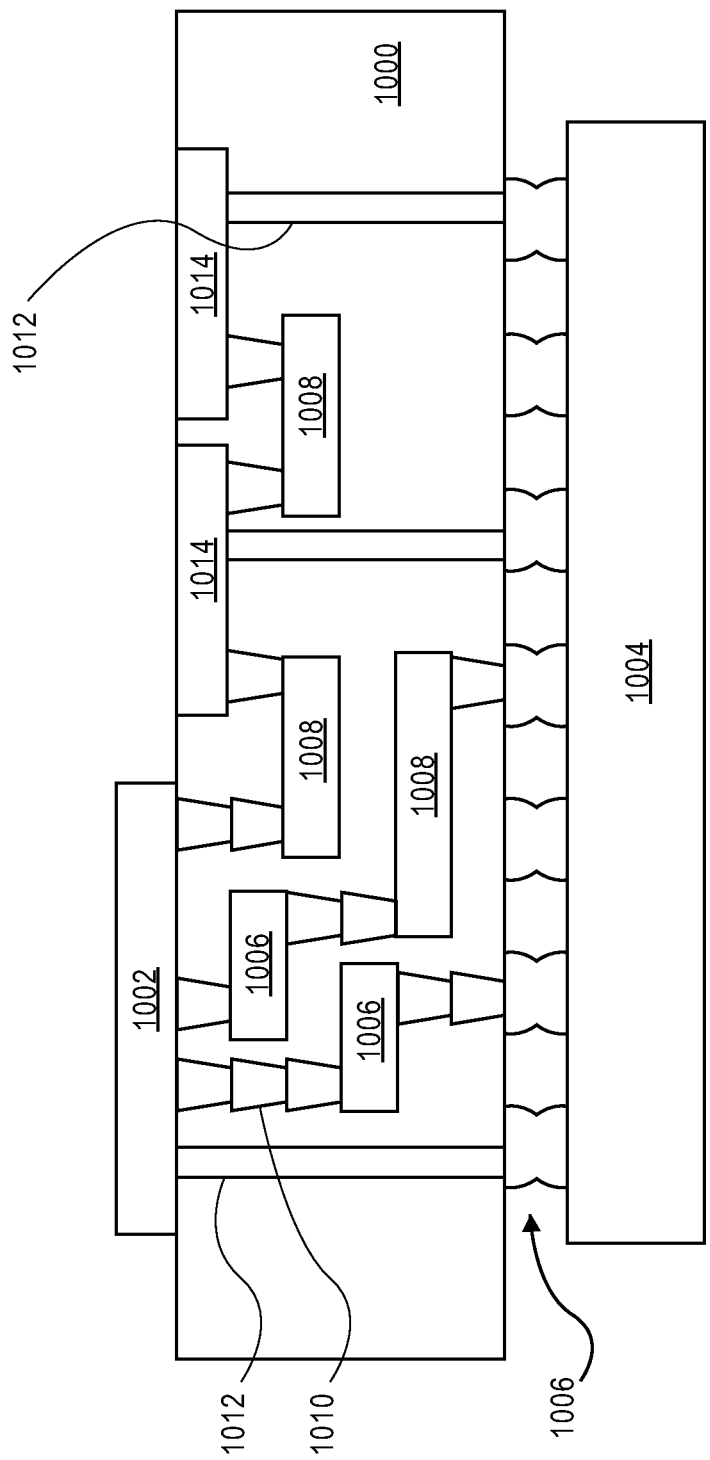
FIG. 7 is a cross-sectional illustration of an interposer implementing one or more embodiments of the invention.

FIG. 7 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses or processes disclosed herein may be used in the fabrication of interposer 1000.

Figure 8:
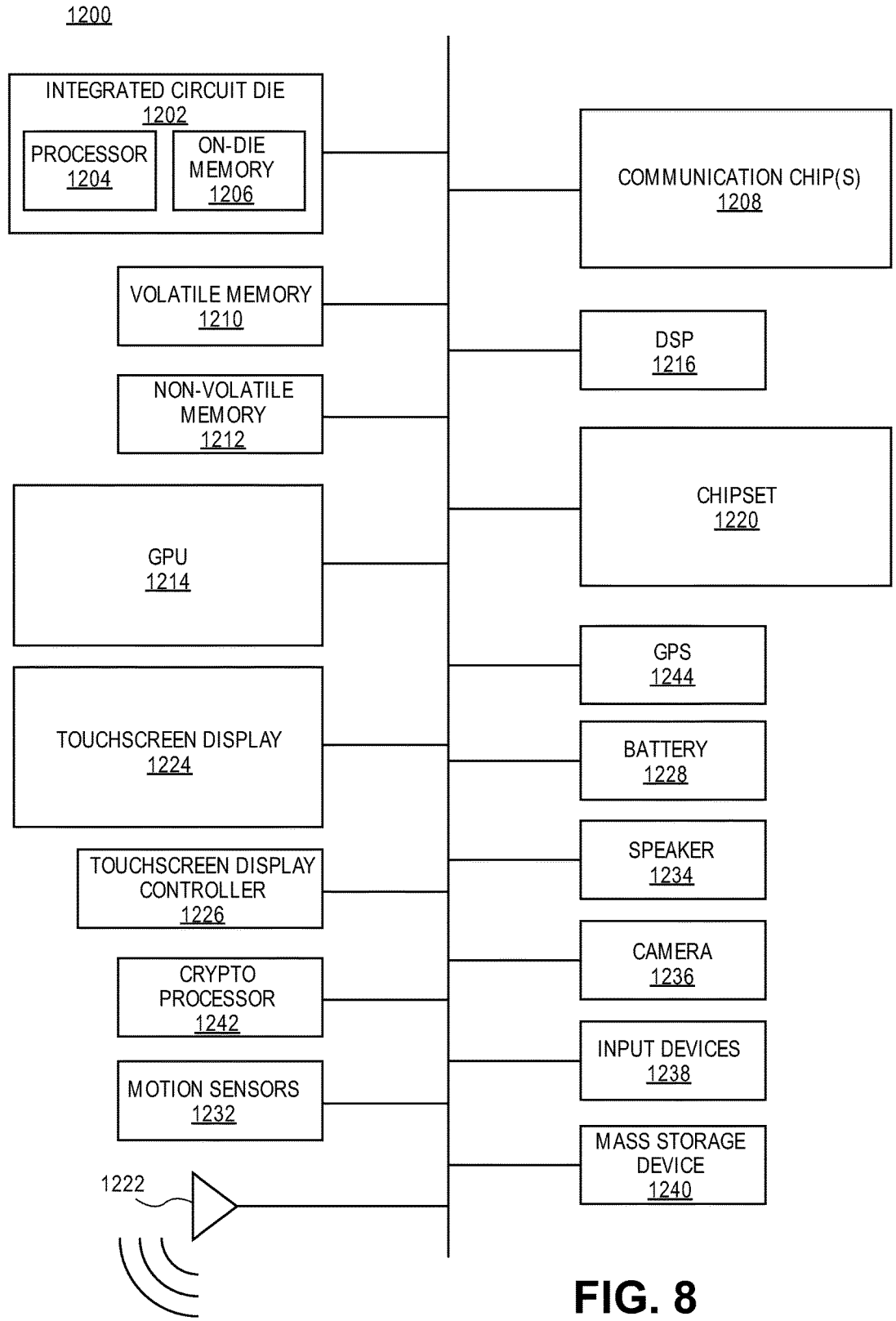
FIG. 8 is a schematic of a computing device built in accordance with an embodiment of the invention.

FIG. 8 illustrates a computing device 1200 in accordance with one embodiment of the invention. The computing device 1200 may include a number of components. In one embodiment, these components are attached to one or more motherboards. In an alternate embodiment, these components are fabricated onto a single system-on-a-chip (SoC) die rather than a motherboard. The components in the computing device 1200 include, but are not limited to, an integrated circuit die 1202 and at least one communication chip 1208. In some implementations the communication chip 1208 is fabricated as part of the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STTM-RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a global positioning system (GPS) device 1228, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications chip 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1208. For instance, a first communication chip 1208 may be dedicated to shorter range wireless communications such as Wi-Fi and Bluetooth and a second communication chip 1208 may be dedicated to longer range wireless communications such as GPS, EDGE, GPRS, CDMA, WiMAX, LTE, Ev-DO, and others.

The processor 1204 of the computing device 1200 includes one or more devices, such as transistors that are coupled to one or more interconnect lines that are formed in an interconnect structure that includes vias that are formed through pre-patterned features in an interconnect layer, according to an embodiment of the invention. The term "processor" may refer to any device or portion of a device that processes electronic data from registers and/or memory to transform that electronic data into other electronic data that may be stored in registers and/or memory.

The communication chip 1208 may also include one or more devices, such as transistors that are coupled to one or more interconnect lines that are formed in an interconnect structure that includes vias that are formed through pre-patterned features in an interconnect layer, according to an embodiment of the invention.

In further embodiments, another component housed within the computing device 1200 may contain one or more devices, such as transistors that are coupled to one or more interconnect lines that are formed in an interconnect structure that includes vias that are formed through pre-patterned features in an interconnect layer, according to an embodiment of the invention.

In various embodiments, the computing device 1200 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a microelectronic device, comprising: one or more pre-patterned features formed into a interconnect layer, wherein the one or more pre-patterned features are defined by at least a first wall, a second wall, and a floor; a conformal barrier layer formed over the first wall, and the second wall of one or more of the pre-patterned features; a photoresist layer formed over the barrier layer and within one or more of the pre-patterned features; and a conductive via formed in at least one of the pre-patterned features. An additional embodiment of the invention includes a microelectronic device, wherein the conformal barrier layer is a self-assembled monolayer (SAM) barrier layer or a polymer brush barrier layer. An additional embodiment of the invention includes a microelectronic device, wherein the conformal barrier layer is a SAM barrier layer, and wherein each molecule of the SAM barrier layer includes a head group and a chain. An additional embodiment of the invention includes a microelectronic device, wherein the head group is a silane head group and the chain is an alkyl chain. An additional embodiment of the invention includes a microelectronic device, wherein the silane head group is an alkoxysilane, aminosilane, or a halogen-terminated silane. An additional embodiment of the invention includes a microelectronic device, wherein the conformal barrier layer is a polymer brush barrier layer, and wherein the polymer brush barrier layer is formed from polymer chains that include one or more of styrenic monomers, acrylic monomers, or methacrylic monomers and derivatives thereof. An additional embodiment of the invention includes a microelectronic device, wherein each molecule of the SAM barrier or each polymer chain of the polymer brush bather layer further includes a photoactive component. An additional embodiment of the invention includes a microelectronic device, wherein the photoactive component is a photoacid generator (PAG). An additional embodiment of the invention includes a microelectronic device, wherein the first wall is formed with a first material, the second wall is formed with a second material, and the photoresist is formed with a third material, and wherein the first material, the second material, and the third material are different from each other. An additional embodiment of the invention includes a microelectronic device, wherein a seam is formed between the first material and the second material, and a seam is formed between the first material and the third material, and a seam is formed between the second material and the third material. An additional embodiment of the invention includes a microelectronic device, wherein the via electrically couples a first interconnect line formed in the interconnect layer to a second interconnect line formed in a second interconnect layer that is below the interconnect layer. An additional embodiment of the invention includes a microelectronic device, wherein the via electrically couples a first interconnect line formed in the interconnect layer to an electrical contact on a substrate formed below the interconnect layer. An additional embodiment of the invention includes a microelectronic device, wherein the conformal barrier layer is also formed over the floor of one or more of the pre-patterned features. An additional embodiment of the invention includes a microelectronic device, wherein the pre-patterned features are 2D pre-patterned features. An additional embodiment of the invention includes a microelectronic device, wherein the pre-patterned features are 1D pre-patterned features.

An additional embodiment of the invention includes a method of forming a microelectronic device, comprising: forming a conformal barrier layer over one or more surfaces of a pre-patterned feature in an interconnect layer; disposing a photoresist material over the barrier layer within the pre-patterned features; exposing the photoresist material in one or more of the pre-patterned features with a radiation source; and developing the exposed photoresist material. An additional embodiment includes a method of forming a microelectronic device, wherein the conformal barrier layer is a self-assembled monolayer (SAM) barrier layer. An additional embodiment includes a method of forming a microelectronic device, wherein the SAM barrier layer is formed over one or more surfaces of the patterned feature with a spin-coating process, a vapor phase deposition process, or a solution phase deposition process. An additional embodiment includes a method of forming a microelectronic device, wherein the conformal barrier layer is a polymer brush bather layer. An additional embodiment includes a method of forming a microelectronic device, wherein the conformal barrier layer is formed over one or more surfaces of the pre-patterned feature with a spin-coating process. An additional embodiment includes a method of forming a microelectronic device, wherein the conformal barrier layer is functionalized with a photoacid generator (PAG). An additional embodiment includes a method of forming a microelectronic device, further comprising: cross-linking the unexposed photoresist material; and depositing a conductive material over the interconnect layer to form one or more vias and one or more interconnect lines.

An additional embodiment includes a method of forming a microelectronic device, comprising: forming a plurality of pre-patterned features in an interconnect layer, wherein each pre-patterned feature includes at least a first wall, a second wall, and a floor; forming a conformal barrier layer over the first wall, and the second wall of one or more of the pre-patterned features; functionalizing the barrier layer with photoacid generators (PAGs); disposing a photoresist material over the barrier layer within the pre-patterned features; exposing the photoresist material in one or more of the pre-patterned features with a radiation source; developing the exposed photoresist material to remove the photoresist material to expose one or more of the pre-patterned features; removing the conformal barrier layer from the exposed pre-patterned features; disposing a conductive material into the exposed pre-patterned features to form one or more conductive vias; and forming an interconnect line above the one or more conductive vias. An additional embodiment includes a method of forming a microelectronic device, wherein the conformal barrier layer is a self-assembled monolayer (SAM) barrier layer or a polymer brush barrier layer. An additional embodiment includes a method of forming a microelectronic device, wherein the first wall is formed with a first material, the second wall is formed with a second material, and the photoresist is formed with a third material, and wherein the first material, the second material, and the third material are different from each other, and wherein a seam is formed between the first material and the second material, and a seam is formed between the first material and the third material, and a seam is formed between the second material and the third material.

What is claimed is:

1. A microelectronic device, comprising:
    one or more pre-patterned features formed into a interconnect layer, wherein the one or more pre-patterned features are defined by at least a first wall, a second wall, and a floor;
    a conformal barrier layer formed over the first wall, and the second wall of one or more of the pre-patterned features;
    a cross-linked photoresist layer formed over the barrier layer and within one or more of the pre-patterned features; and
    a conductive via formed in at least one of the pre-patterned features.

2. The microelectronic device of claim 1, wherein the conformal barrier layer is a self-assembled monolayer (SAM) barrier layer or a polymer brush barrier layer.

3. The microelectronic device of claim 2, wherein the conformal barrier layer is a SAM barrier layer, and wherein each molecule of the SAM barrier layer includes a head group and a chain.

4. The microelectronic device of claim 3, wherein the head group is a silane head group and the chain is an alkyl chain.

5. The microelectronic device of claim 4, wherein the silane head group is an alkoxysilane, aminosilane, or a halogen-terminated silane.

6. The microelectronic device of claim 2, wherein the conformal barrier layer is a polymer brush barrier layer, and wherein the polymer brush barrier layer is formed from polymer chains that include one or more of methyl acrylate (MA), N,N-dimethylacrylamide (DMA), N,N-dimethylamino ethyl methacrylate (DMAEMA), styrene, methyl methacrylate (MMA).

7. The microelectronic device of claim 2, wherein each molecule of the SAM barrier or each polymer chain of the polymer brush barrier layer further includes a photoactive component.

8. The microelectronic device of claim 7, wherein the photoactive component is a photoacid generator (PAG).

9. The microelectronic device of claim 1, wherein the first wall is formed with a first material, the second wall is formed with a second material, and the cross-linked photoresist is formed with a third material, and wherein the first material, the second material, and the third material are different from each other.

10. The microelectronic device of claim 9, wherein a seam is formed between the first material and the second material, and a seam is formed between the first material and the third material, and a seam is formed between the second material and the third material.

11. The microelectronic device of claim 1, wherein the via electrically couples a first interconnect line formed in the interconnect layer to a second interconnect line formed in a second interconnect layer that is below the interconnect layer.

12. The microelectronic device of claim 1, wherein the via electrically couples a first interconnect line formed in the interconnect layer to an electrical contact on a substrate formed below the interconnect layer.

13. The microelectronic device of claim 1, wherein the conformal barrier layer is also formed over the floor of one or more of the pre-patterned features.

14. The microelectronic device of claim 1, wherein the pre-patterned features are 2D pre-patterned features.

15. The microelectronic device of claim 1, wherein the pre-patterned features are 1D pre-patterned features.

* * * * *